United States Patent
Chang et al.

(10) Patent No.: US 11,849,574 B2
(45) Date of Patent: Dec. 19, 2023

(54) LAYOUT STRUCTURE OF STORAGE CELL AND MANUFACTURING METHOD THEREOF

(71) Applicant: TAIWAN SEMICONDUCTOR MANUFACTURING COMPANY LTD., Hsinchu (TW)

(72) Inventors: Meng-Sheng Chang, Hsinchu County (TW); Chia-En Huang, Hsinchu County (TW); Yih Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 85 days.

(21) Appl. No.: 17/381,090

(22) Filed: Jul. 20, 2021

(65) Prior Publication Data
US 2021/0351193 A1 Nov. 11, 2021

Related U.S. Application Data

(62) Division of application No. 16/514,863, filed on Jul. 17, 2019, now Pat. No. 11,094,701.

(51) Int. Cl.
*H10B 20/20* (2023.01)
*H01L 23/525* (2006.01)
*G11C 17/16* (2006.01)
*H01L 23/528* (2006.01)
*G11C 17/18* (2006.01)

(52) U.S. Cl.
CPC ............. *H10B 20/20* (2023.02); *G11C 17/16* (2013.01); *G11C 17/18* (2013.01); *H01L 23/528* (2013.01); *H01L 23/5256* (2013.01)

(58) Field of Classification Search
CPC ... H01L 23/5256; H01L 23/528; G11C 17/18; G11C 17/16; H10B 20/20
See application file for complete search history.

(56) References Cited

U.S. PATENT DOCUMENTS

| | | | |
|---|---|---|---|
| 9,006,794 B1* | 4/2015 | Xie | H01L 23/5256 257/209 |
| 11,094,701 B2* | 8/2021 | Chang | H01L 23/528 |
| 2017/0345827 A1* | 11/2017 | Chang | G11C 17/18 |
| 2020/0058580 A1* | 2/2020 | Lin | H01L 23/5228 |

* cited by examiner

*Primary Examiner* — Suberr L Chi
(74) *Attorney, Agent, or Firm* — WPAT LAW; Anthony King

(57) ABSTRACT

A method of forming a storage cell includes: forming a transistor on a semiconductor substrate; forming a plurality of fuses in at least one conductive layer on the semiconductor substrate to couple a connecting terminal of the transistor; forming a bit line to couple the plurality of fuses; and forming a word line to couple a control terminal of the transistor.

20 Claims, 9 Drawing Sheets

LAYOUT STRUCTURE OF STORAGE CELL AND MANUFACTURING METHOD THEREOF

CROSS-REFERENCE TO RELATED APPLICATIONS

This application is a divisional application of U.S. patent application Ser. No. 16/514,863 filed on Jul. 17, 2019, which is hereby incorporated by reference.

BACKGROUND

In an integrated circuit (IC), fuses are often used to store permanent information or form permanent connections. For example, fuses may be used to fix incorrect circuit connections and replace defective elements the IC. Fuses may also be used for chip identification or in the implementation of security features. Fuses may also be used for analog trimming or calibration to improve the circuit function. Fuses may also be used for inventory control by enabling or disabling features in the IC. Fuses may also be used as one time programmable (OTP) memory elements that can be programmed once the chip is in packaged form. One time programmable memory elements are used in the IC to provide non-volatile memory ("NVM"). Data in NVM are not lost when the IC turned off. NVM allows an IC manufacturer to store lot number and security data on the IC, for example, and is useful in many other applications. One type of NVM is commonly called an electrical fuse (E-fuse). However, a person may get the manufacturer's proprietary code or information embedded in the E-fuses through the way of reverse, engineering (e.g. physical failure analysis, PFA). Therefore, there is an urgent need to enhance the security of fuse array in the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
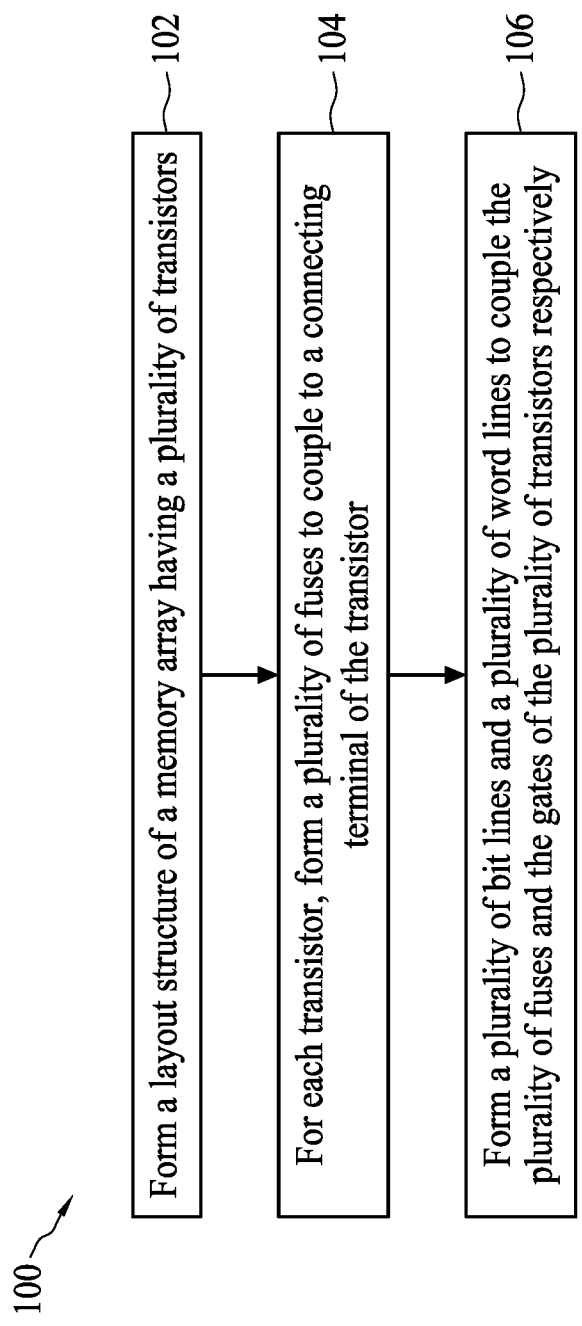
FIG. 1 is a flowchart illustrating a method for forming a layout structure of a memory array according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

E-fuses are usually integrated into semiconductor ICs by using a narrow stripe of conducting material (metal, polysilicon, etc.) between two conductive pads, generally referred to as anode and cathode. Applying a programming current to the fuse to destroy or fuse the conductive link, thus changing the resistance of the E-fuse. This is commonly referred to as "programming" the E-fuse. The fuse state (i.e., programmed or non-programmed) may be read by using a sense circuit.

During programming, current is applied through the fuse link for a specified period. The programming current heats up the fuse link more than the adjacent areas due to current crowding and differences in heat dissipation, creating a temperature gradient. The temperature gradient and the carrier flux causes electro- and stress-migration to take place and drive material (e.g., silicide, dopant, and polysilicon) away from the fuse link.

Programming generally converts the E-fuse from an original resistance to a programmed resistance. It is desirable for the programmed resistance to be much higher (typically many orders of magnitude higher) than the original resistance to allow reliable reading of the E-fuse using a sensing circuit. A first logic state (e.g., a logical "0") is typically assigned to a non-programmed, low-resistance fuse state, and a second logic state (e.g., logical "1") to the programmed, high-resistance fuse state. The change in resistance is sensed (read) by a sensing circuit to produce a data bit.

FIG. 1 is a flowchart illustrating a method 100 for forming a layout structure of a memory array according to some embodiments. The method 100 is executable by a processor or manual. Some of the operations in the method 100 may by manually executed. The method 100 may be compiled in a computer readable program. The computer readable program may be stored in a memory device. The processor may read or reload the computer readable program from the memory device to execute the method 100 upon the layout structure of the memory array. The layout structure of the memory array is composed of a plurality of transistors and a plurality of fuses. The plurality of transistors and the plurality of fuses are configured to be a plurality of storage cells respectively. Generally speaking, the method 100 is designed to form the plurality of fuses for coupling the plurality of transistors of the memory array respectively. Specifically, for each transistor, the method 100 is designed to form a plurality of serially connected fuses to couple to a first connecting terminal (e.g. drain) of the transistor.

According to some embodiments, the method 100 comprises operations 102~106. In operation 102, a layout structure of a memory array having a plurality of transistors is formed. The plurality of transistors are formed in a semiconductor substrate. The plurality of transistors may be regarded as the front-end-of-lines (FEOL) of the memory array.

In operation 104, for each transistor of the plurality of transistors, a plurality of fuses are formed to couple to the first connecting terminal (e.g. the drain) of the transistor. According to some embodiments, a first pad of the plurality of fuses is coupled to the first connecting terminal of the transistor, and a second pad of the plurality of the fuses is coupled to a bit line of the memory array. Moreover, the control terminal (e.g. the gate) of the transistor is coupled to a word line of the memory array. The plurality of fuses may be regarded as the back-end-of-lines (BEOL) of the memory array. In addition, for a fuse, the first pad and the second pad are conductive pads, and a conductive link is connected between the first pad and the second pad.

For example, in operation 104, two serially connected fuses are formed between a bit line and the drain of a transistor. Specifically, the first pad of the first fuse is coupled to the bit line, the second pad of the first fuse is coupled to the first pad of the second fuse, and the second pad of the second fuse is coupled to the drain of the transistor. The first fuse and the second fuse may be formed in different conductive layers above the semiconductor substrate. The conductive layers may be the metal layers above the semiconductor substrate respectively. For example, the first fuse may be formed in the fourth metal layer (i.e. M4), and the second fuse may be formed in the second metal layer (i.e. M2). However, this is not a limitation of the present embodiment. The first fuse and the second fuse may be formed in the same metal layer above the semiconductor substrate. For example, the first fuse and the second fuse may be formed in the fourth metal layer (i.e. M4).

In operation 106, a plurality of bit lines and a plurality of word lines are formed to couple the plurality of second pads of the plurality of the fuses and the gates of the plurality of transistors respectively.

It is noted that the operations 102-106 are the simplified operation for forming the layout structure of the fusible memory array. Other operations may be included to form the other structures of the fusible memory array. Moreover, the gates of the plurality of transistors may be formed by a plurality of polysilicon lines, and the word lines may be formed by metal lines.

When the layout structure of the fusible memory array is designed, a fabrication process may be performed to fabricate a physical memory array of the layout structure.

When the physical memory array is fabricated, the memory array may undergo a programming process to burn or fuse the plurality of fuses coupled to the corresponding transistors to be programmed. As there have two fuses assigned for each transistor, one or both of the fuses may be burned if the transistor is programmed. According to some embodiments, the programming process may randomly burn or fuse one or both of the fuses coupled to the programmed transistor. For example, for a storage cell that stored the logical "1", the first fuse in the upper metal layer (e.g. M4) may be burned while the second fuse in the lower metal layer (e.g. M2) may not be burned during the programming process. As the burnt fuses are not located in the same metal layer above the semiconductor substrate, a person may not easy to obtain the manufacturer's proprietary code or information embedded in the memory array through the way of reverse engineering.

According to some embodiments, the transistor of a storage cell may be a field-effect transistor (FET), and a plurality of polysilicon lines (i.e. the control electrode) may be disposed on the diffusion area or active area of the field-effect transistor for inducing a magnetic field on the diffusion area. Therefore, the polysilicon line(s) may be regarded as a gate terminal of the field-effect transistor.

Figure 2:
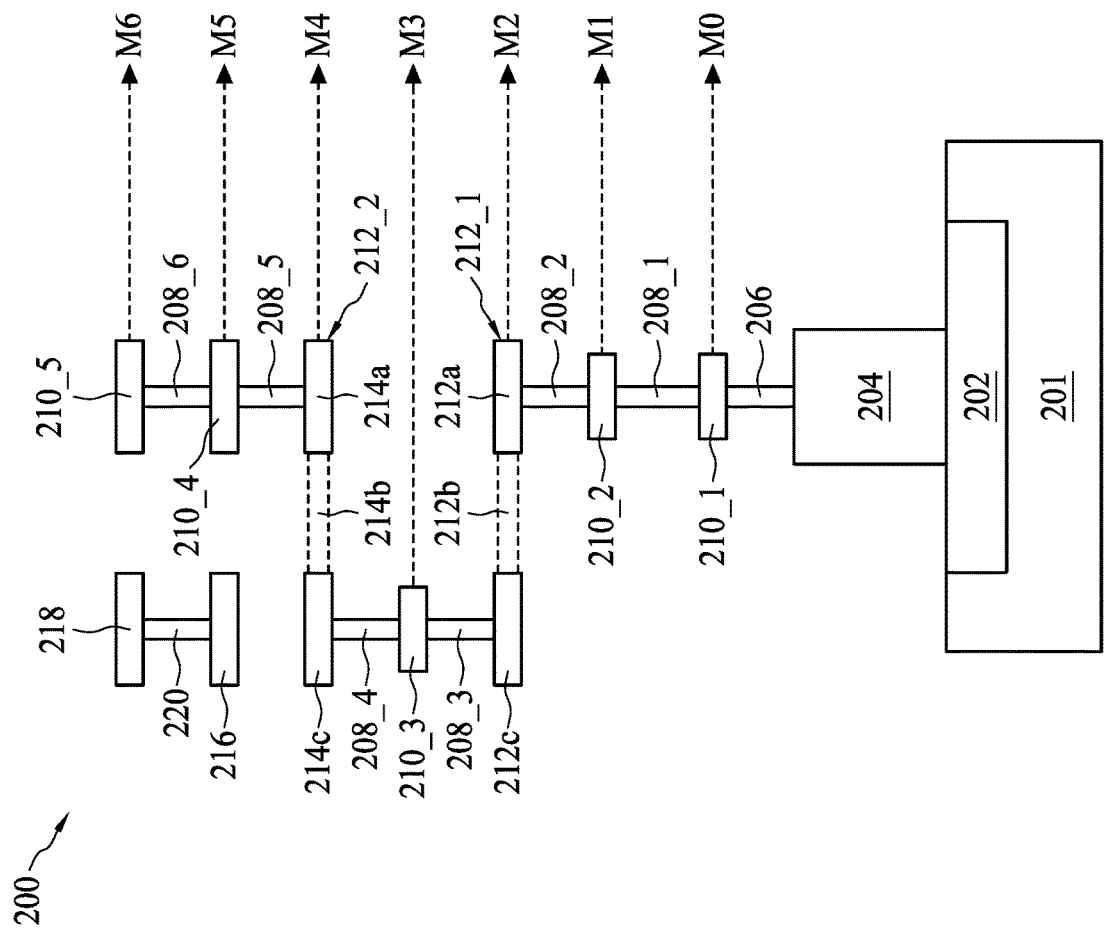
FIG. 2 is a cross-sectional diagram illustrating a layout structure of a storage cell in a memory array in accordance with some embodiments.

FIG. 2 is a cross-sectional diagram illustrating a layout structure 200 of a storage cell in a memory array in accordance with some embodiments. The memory array may be a fusible memory array. The layout structure 200 comprises a transistor 202, a metal-over-oxide (MD) layer 204, a contact 206, a plurality of via structures 208_1-208_6, a plurality of metal lines 210_1-210_5, and a plurality of fuses 212_1-212_2. The transistor 202 is formed in a semiconductor substrate 201. For brevity, the detailed structure of the transistor 202 is omitted here for brevity. The MD layer 204 is formed on the first connecting terminal (e.g. drain) of the transistor 202. The contact 206 is formed on the MD layer 204. The metal lines 210_1-210_5 are formed in the metal layers M0, M1, M3, M5, and M6 above the semiconductor substrate 201 respectively. The fuses 212_1-212_2 are formed in the metal layers M2 and M4 respectively. The via structures 208_1-208_6 are formed between the metal layers M0 and M1, M1 and M2, M2 and M3, M3 and M4, M4 and M5, and M5 and M6 respectively. According to some embodiments, the transistor 202, the MD layer 204, and the contact 206 may be regarded as the FEOL of the memory array. The via structures 208_1-208_6, the metal lines 210_1-210_5, and the fuses 212_1-212_2 may be regarded as the BEOL of the memory array.

According to some embodiments, the layout structure 200 further comprises a metal line 216 formed in the metal layer M5, a metal line 218 formed in the metal layer M6, and a via structure 220 connected the metal lines 216 and 218. The metal line 216 is coupled to the source of the transistor 202, and the metal line 218 is coupled to the ground Vss. The detailed layout of the connection is omitted here for brevity.

The first fuse 212_1 comprises a first pad (or conductive pad) 212a, a link (or conductive link) 212b, and a second pad 212c. The link 212b is arranged to connect the first pad 212a and the second pad 212c. The second fuse 212_2 comprises a first pad 214a, a link 214b, and a second pad 214c. The link 214b is arranged to connect the first pad 214a and the second pad 214c. According to some embodiments, the first fuse 212_1 and the second fuse 212_2 are connected in series between the drain (e.g. the MD layer 204) of the transistor and the bit line (e.g. the metal line 210_5). Specifically, the first pad 212*a* is electrically connected to the via structure 208_2. The second pad 212*c* is electrically connected to the via structure 208_3. The first pad 214*a* is electrically connected to the via structure 208_5. The second pad 214*c* is electrically connected to the via structure 208_4.

It is noted that the first fuse 212_1 and the second fuse 212_2 are not limited to form in the metal layers M2 and M4 respectively. The first fuse 212_1 and the second fuse 212_2 may be formed in any two metal layers among the metal layers M0, M1, M3, M5, and M6. For example, in another embodiment, the first fuse 212_1 may be formed in the metal layer M1, and the second fuse 212_2 may be formed in the metal layer M5. In this embodiment, the second pad 212*c* of the first fuse 212_1 is electrically connected to the second pad 214*c* of the second fuse 212_2 through the metal lines in the metal layers M2, M3, and M4, and the via structures between the metal layers M1 and M2, M2 and M3, M3 and M4, and M4 and M5. The detailed description of this layout structure is omitted here for brevity.

Yet in another embodiment, the first fuse 212_1 may be formed in the metal layer M2, and the second fuse 212_2 may be formed in the metal layer M3. In this embodiment, the second pad 212*c* of the first fuss; 212_1 is electrically connected to the second pad 214*c* of the second fuse 212_2 through the via structure between the metal layers M2 and M3. The detailed description of this layout structure is also omitted here for brevity.

It is noted that FIG. 2 merely shows an example of the layout structure 200 of a storage cell in the memory array. In another storage cell of the memory array, the layout structure of the another storage cell may be different from the layout structure 200. For example, in the another storage cell of the memory array, the first fuse 212_1 may be formed in the metal layer M1, and the second fuse 212_2 may be formed in the metal layer M5. Yet in the another storage cell of the memory array, the first fuse 212_1 may be formed in the metal layer M2, and the second fuse 212_2 may be formed in the metal layer M3.

Accordingly, for each storage cell in the memory array, the first fuse 212_1 and the second fuse 212_2 may be formed in two predetermined metal layers (e.g. M2 and M4) in the metal layers M0, M1, M3, M5, and M6. For each storage cell in the memory array, the first fuse 212_1 and the second fuse 212_2 may also be randomly formed in any two metal layers among the metal layers M0, M1, M3, M5, and M6.

Figure 3:
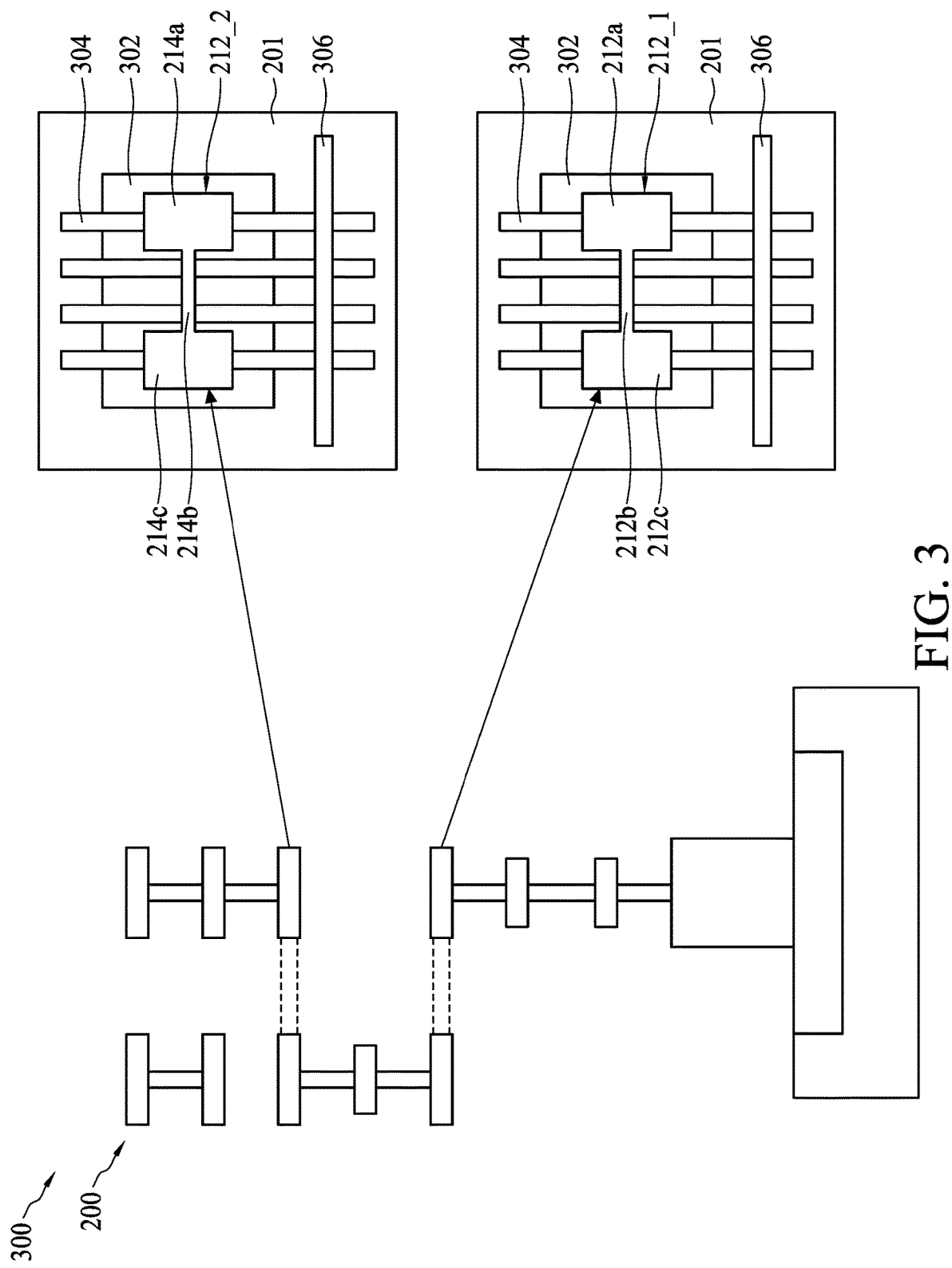
FIG. 3 is a diagram illustrating the top view of a first fuse and a second fuse of a layout structure in accordance with some embodiments.

FIG. 3 is a diagram illustrating the top view of the first fuse 212_1 and the second fuse 212_2 of the layout structure 200 in accordance with some embodiments. For illustrative purpose, the layout structure 200 is also shown in FIG. 3. Moreover, a diffusion area 302, a plurality of polysilicon lines 304, and a word line 306 are also shown in FIG. 3. The diffusion area 302 may be the active area of the transistor 202, the polysilicon lines 302 may be the gate electrode of the transistor 202, and the word line 306 is electrically connected to the polysilicon lines 302. For brevity, the MD layer 204, the contact 206, the via structures 208_1-208_6 and the metal lines 210_1-210_5 are omitted in the top view diagram of the first fuse 212_1 and the second fuse 212_2.

According to some embodiments, the first fuse 212_1 is overlapped with the second fuse 212_2 viewed from the top of the memory array. However, this is not a limitation of the present embodiments. In another embodiment, the first fuse 212_1 may partially overlap or not overlap with and the second fuse 212_2 viewed from the top of the memory array.

Moreover, the first fuse 212_1 and the second fuse 212_2 may be designed to have the similar or identical shape. For example, the area of the first pad 212*a* is substantially equal to the area of the first pad 214*a*, the area of the second pad 212*c* is substantially equal to the area of the second pad 214*c*, the length and the width of the link 212*b* are substantially equal to the length and the width of the link 214*b* substantially. However, this is not a limitation of the present embodiment. In another embodiment, the first fuse 212_1 and the second fuse 212_2 may be designed to have the different shapes or sizes.

Figure 4:
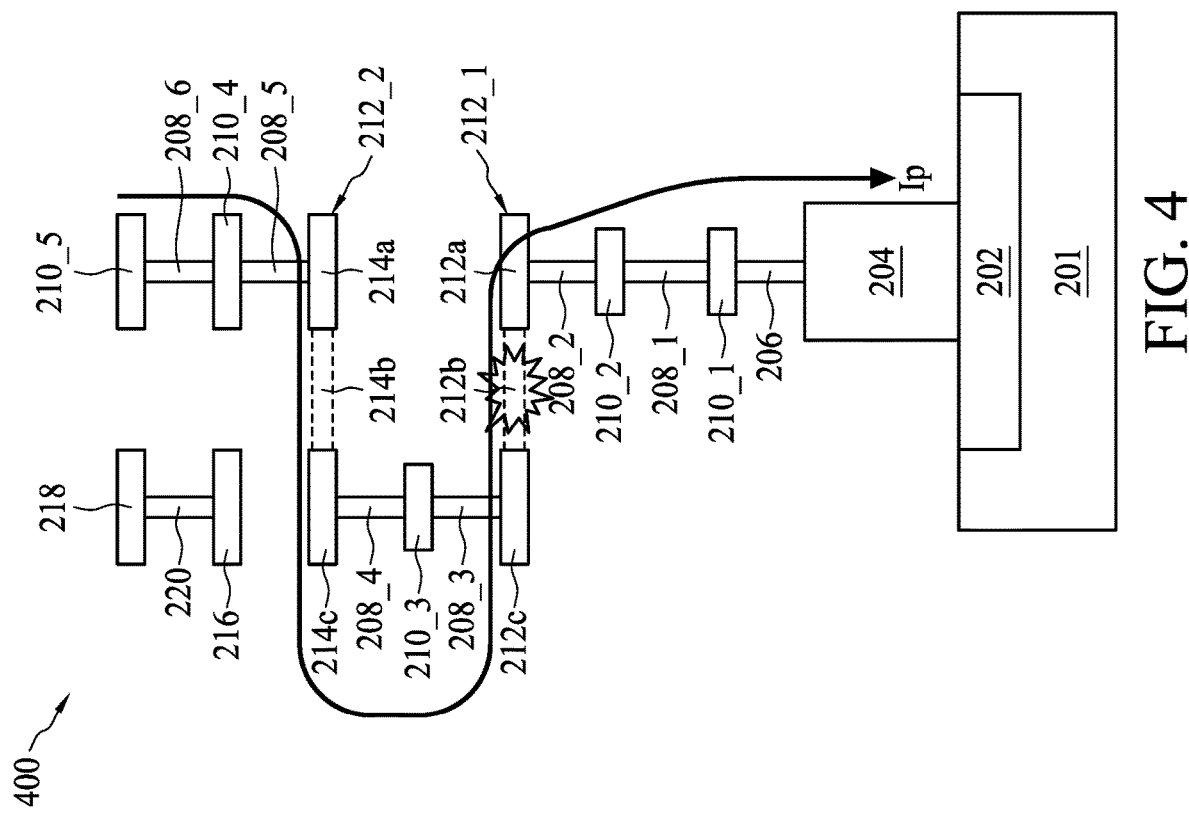
FIG. 4 is a cross-sectional diagram illustrating a storage cell being programmed during a programming process in accordance with some embodiments.

When the memory array is fabricated, the link 212*b* and the 214*b* of the storage cell 200 may be regarded as a first resistive element with a first resistance and a second resistive element with a second resistance respectively. The first resistance may be equal to the second resistance. Then, the memory array may undergo a programming process to burn or fuse the plurality of fuses coupled to the corresponding transistors to be programmed. According to some embodiments, if the storage cell of FIG. 2 is to be programmed during the programming process, the programming current may randomly burn or fuse one or both of the fuses 212_1 and 212_2 of the storage cell. FIG. 4 is a cross-sectional diagram illustrating a storage cell 400 being programmed during the programming process in accordance with some embodiments. The storage cell 400 may be the implementation of the layout structure 200. For brevity, the numerals in the storage cell 400 in FIG. 4 are arranged to be similar to the numerals of the layout structure 200 in FIG. 2. During the programming process, the transistor 202 is turned on and a predetermined current Ip is arranged to flow to the source, which is coupled to the ground, of the transistor 202 from the metal line 210_5 (i.e. the bit line). The predetermined current Ip may flow through the metal line 210_5, the via structure 208_6, the metal line 210_4, the via structure 208_5, the first pad 214*a*, the link 214*b*, the second pad 214*c*, the via structure 208_4, the metal line 210_3, the second pad 212*c*, the link 212*b*, the pad 212*a*, the via structure 208_2, the metal line 210_2, the via structure 208_1, the metal line 210_1, the contact 206, and the MD layer 204. The predetermined current Ip is arranged to randomly burn the link 212*b* of the first fuse 212_1 or the link 214*b* of the second fuse 212_2. In this embodiment, the link 212*b* of the first fuse 212_1 is burned by the predetermined current Ip. When the link 212*b* of the first fuse 212_1 is burned, the resistance of the link 212*b* may much greater than the resistance of the link 214*b* or the link 212*b* may just open such that the path between the bit line and the transistor 202 may open permanently. Accordingly, the storage cell is programmed to store a data with logical "1" (for example).

Figure 5:
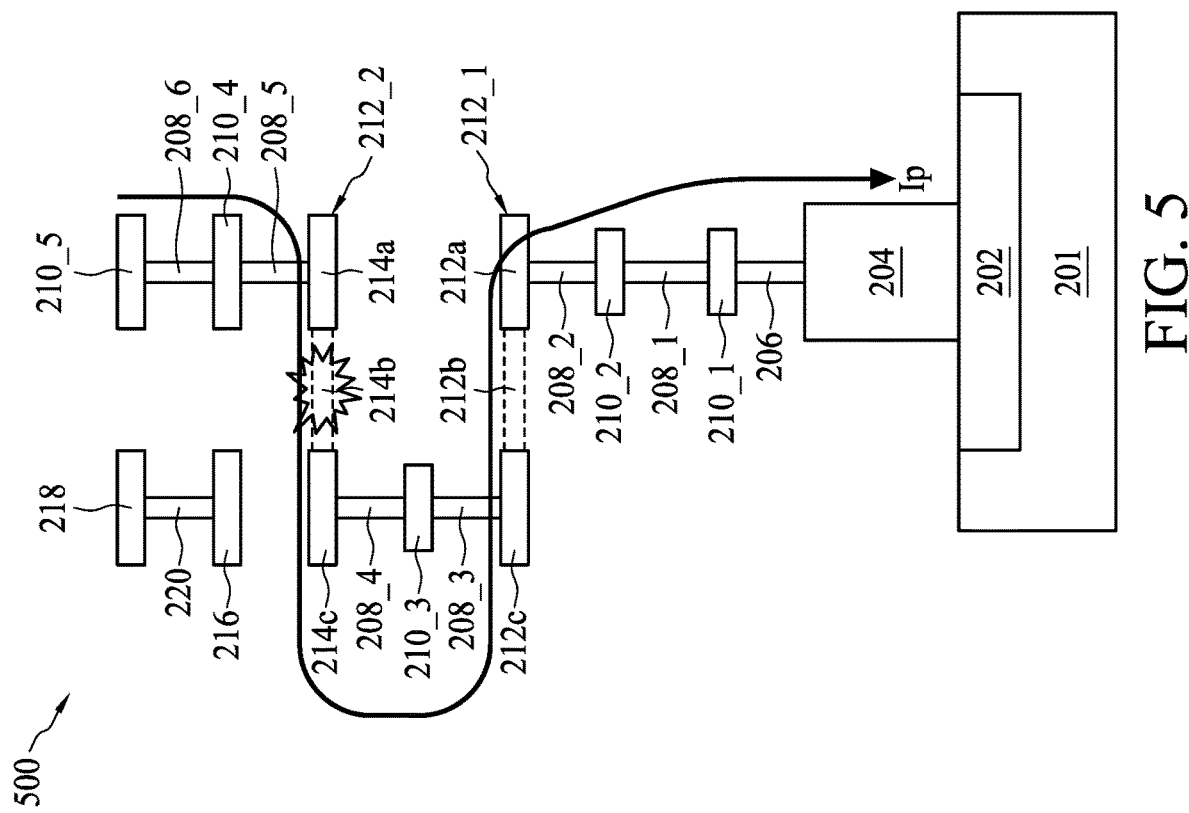
FIG. 5 is a cross-sectional diagram illustrating a storage cell being programmed during a programming process in accordance with some embodiments.

FIG. 5 is a cross-sectional diagram illustrating a storage cell 500 being programmed during the programming process in accordance with some embodiments. The storage cell 500 may be the implementation of the layout structure 200. For brevity, the numerals in the storage cell 500 in FIG. 5 are arranged to be similar to the numerals of the layout structure 200 in FIG. 2. During the programming process, the transistor 202 is turned on and the predetermined current Ip is arranged to flow to the source, which is coupled to the ground, of the transistor 202 from the metal line 210_5 (i.e. the bit line) to randomly burn the link 212*b* of the first fuse 212_1 or the link 214*b* of the second fuse 212_2, In this embodiment, the link 214*b* of the second fuse 212_2 is burned by the predetermined current Ip. When the link 214*b* of the second fuse 212_1 is burned, the resistance of the link 214*b* may much greater than the resistance of the link 212*b* or the link 214*b* may just open such that the path between the bit line and the transistor 202 may open permanently. Accordingly, the storage cell is programmed to store a data with logical "1" (for example).

In some cases, the predetermined current Ip may burn the link 212$b$ of the first fuse 212_1 and the link 214$b$ of the second fuse 212_2 at the same time during the programming process.

As the first fuse 212_1 and the second fuse 212_2 of a storage cell are randomly burned by the predetermined current Ip, the burnt fuses of the storage cells being programmed may randomly distribute in the two different metal layers (e.g. M2 and M4) above the semiconductor substrate 201. Accordingly, a person may not easy to obtain the manufacturer's proprietary code or information embedded in the memory array through the way of reverse engineering.

It is noted that if the storage cell 200 of FIG. 2 is programmed to store a data with logical "0" (for example), then the link 212$b$ and the link 214$b$ may not be burned during the programming process. Accordingly, the link 212$b$ and the link 214$b$ may be kept intact, and the resistance of the link 212$b$ may be equal to the resistance of the link 214$b$ after the programming process.

Figure 6:
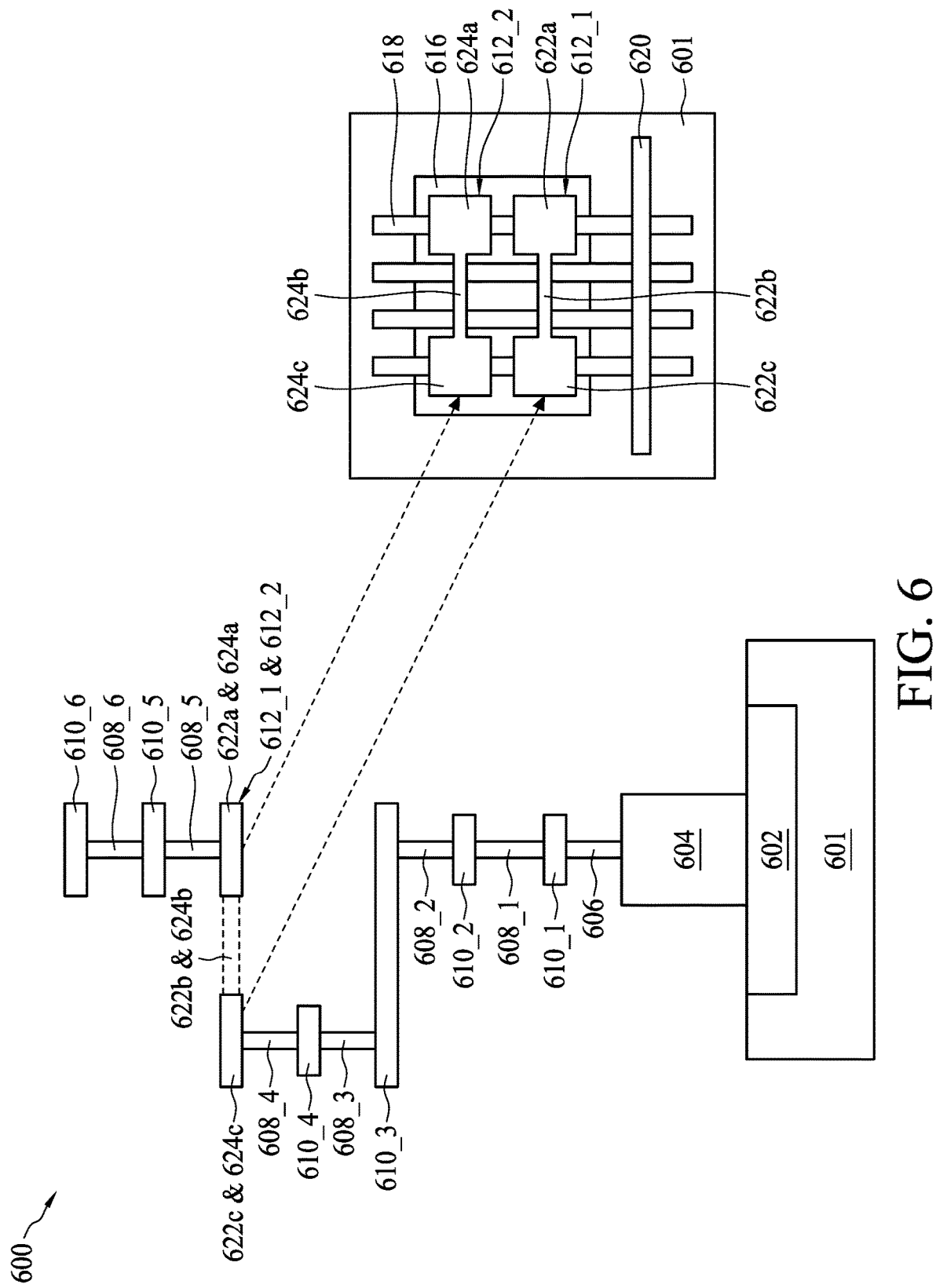
FIG. 6 is a cross-sectional diagram illustrating a layout structure of a storage cell in a memory array in accordance with some embodiments.

FIG. 6 is a cross-sectional diagram illustrating a layout structure 600 of a storage cell in a memory array in accordance with some embodiments. The memory array may be a fusible memory array. The layout structure 600 comprises a transistor 602, a metal-over-oxide (MD) layer 604, a contact 606, a plurality of via structures 608_1-608_6, a plurality of metal lines 610_1-610_6, and a plurality of fuses 612_2. The transistor 602 is formed in a semiconductor substrate 601. For brevity, the detailed structure of the transistor 602 is omitted here for brevity. The MD layer 604 is formed on the first connecting terminal (e.g. drain) of the transistor 602. The contact 606 is formed on the MD layer 604. The metal lines 610_1-610_6 are formed in the metal layers M0, M1, M2, M3, M5, and M6 above the semiconductor substrate 601 respectively. The fuses 612_1-612_2 are formed in the metal layer M4. The via structures 608_1-608_6 are formed between the metal layers M0 and M1, M1 and M2, M2 and M3, M3 and M4, M4 and M5, and M5 and M6 respectively. According to some embodiments, the transistor 602, the MD layer 604, and the contact 606 may be regarded as the FEOL, of the memory array. The via structures 608_1-608_6, the metal lines 610_1-610_6, and the fuses 612_1-612_2 may be regarded as the BEOL of the memory array.

For descriptive purpose, the top view of the first fuse 612_1 and the second fuse 612_2 are also shown in FIG. 6. Moreover, a diffusion area 616, a plurality of polysilicon lines 618, and a word line 620 are also shown in FIG. 3. The diffusion area 616 may be the active area of the transistor 602, the polysilicon lines 618 may be the gate electrode of the transistor 602, and the word line 620 is electrically connected to the polysilicon lines 618.

The first fuse 612_1 comprises a first pad 622$a$, a link 622$b$, and a second pad 622$c$. The link 622$b$ is arranged to connect the first pad 622$a$ and the second pad 622$c$. The second fuse 612_2 comprises a first pad 624$a$, a link 624$b$, and a second pad 624$c$. The link 624$b$ is arranged to connect the first pad 624$a$ and the second pad 624$c$. According to some embodiments, the first fuse 612_1 and the second fuse 612_2 are connected in series between the drain (e.g. the MD layer 604) of the transistor and the bit line (e.g. the metal line 610_6). In this embodiment, the first pad 622$a$ is electrically connected to the first pad 624$a$ by a metal line (not shown in FIG. 6) in the metal layer M4. The upper surface of the second pad 624$c$ is electrically connected to the via structure 608_5. The lower surface of the second pad 622$c$ is electrically connected to the via structure 608_4.

Moreover, the first fuse 612_1 and the second fuse 612_2 may be designed to have the similar shape. For example, the area of the first pad 622$a$ is substantially equal to the area of the first pad 624$a$, the area of the second pad 622$c$ is substantially equal to the area of the second pad 624$c$, the length and the width of the link 622$b$ are substantially equal to the length and the width of the link 624$b$ substantially. However, this is not a limitation of the present embodiment. In another embodiment, the first fuse 612_1 and the second fuse 612_2 may be designed to have the different shapes or sizes.

When the memory array is fabricated, the memory array may undergo a programming process to burn or fuse the plurality of fuses coupled to the corresponding transistors to be programmed. According to some embodiments, if the storage cell of FIG. 6 is to be programmed during the programming process, the programming current may randomly burn or fuse one or both of the fuses 612_1 and 612_2 of the storage cell. Specifically, the predetermined programming current may flow through the second pad 624$c$, the link 624$b$, the first pad 624$a$, the metal line (not shown) connecting the first pad 624$a$ and the first pad 622$a$, the first pad 622$a$, the link 622$b$, and the second pad 622$c$ to randomly burn one or both of the links 624$b$ and 622$b$.

As the first fuse 612_1 and the second fuse 612_2 of a storage cell are randomly burned by the predetermined programming current, the burnt fuses of the storage cells being programmed may randomly distribute in a metal layer (e.g. M4) above the semiconductor substrate 601. Accordingly, a person may not easy to obtain the manufacturer's proprietary code or information embedded in the memory array through the way of reverse engineering.

Instead of serially connected fuses, in some embodiments, the first fuse 612_1 and the second fuse 612_2 may be configured as two parallel connected fuses in the metal layer M4. By doing this, during the programming process, the predetermined programming current may be separated by the first fuse 612_1 and the second fuse 612_2, and the separated currents may randomly burn one or both of the first fuse 612_1 and the second fuse 612_2.

Figure 7:
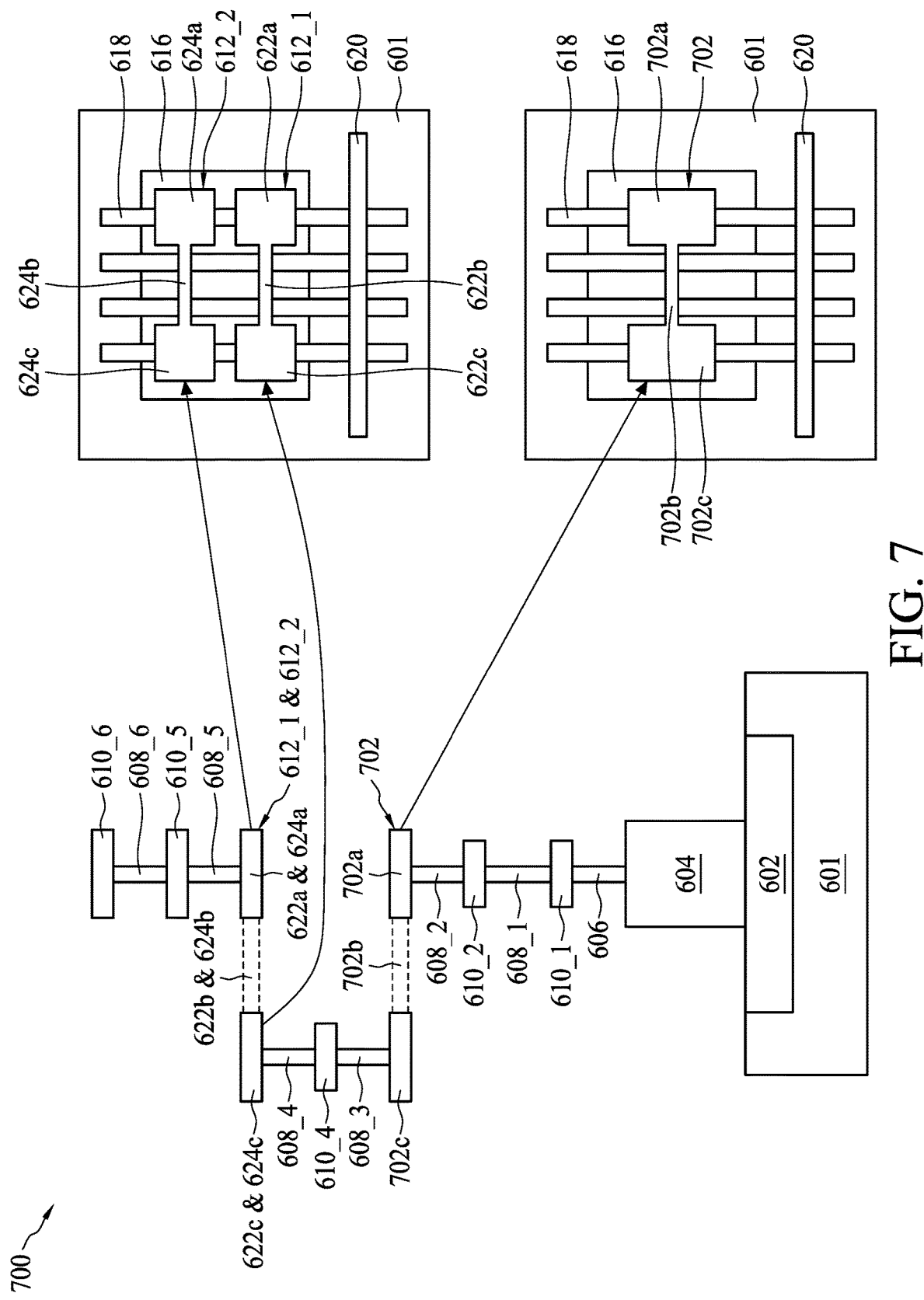
FIG. 7 is a cross-sectional diagram illustrating a layout structure of a storage cell in a memory array in accordance with some embodiments.

FIG. 7 is a cross-sectional diagram illustrating a layout structure 700 of a storage cell in a memory array in accordance with some embodiments. The memory array may be a fusible memory array. In comparison the layout structure 600, the metal line 610_3 of the layout structure 600 is replaced with the third fuse 702 of the layout structure 700. For brevity, except for the third fuse 702, the numerals in the layout structure 700 in FIG. 7 are arranged to be similar to the numerals of the layout structure 600 in FIG. 6.

For descriptive purpose, the top view of the third fuse 702 is also shown in FIG. 7. The third fuse 702 comprises a first pad 702$a$, a link 702$b$, and a second pad 702$c$. The link 702$b$ is arranged to connect the first pad 702$a$ and the second pad 702$c$. According to some embodiments, the first fuse 612_1, the second fuse 612_2, and the third fuse 702 are connected in series between the drain (e.g. the MD layer 604) of the transistor and the bit line (e.g. the metal line 610_6). The lower surface of the first pad 702$a$ is electrically connected to the via structure 608_2. The upper surface of the second pad 702$c$ is electrically connected to the via structure 608_3. Moreover, the third fuse 702 is similar to the fuse 212_1, thus the detailed description is omitted here for brevity.

When the memory array is fabricated, the memory array may undergo a programming process to burn or fuse the plurality of fuses coupled to the corresponding transistors to be programmed. According to some embodiments, if the storage cell of FIG. 7 is to be programmed during the programming process, the programming current may randomly burn or fuse one or two or all of the fuses 612_1, 612_2, and 702 of the storage cell. Specifically, the predetermined programming current may flow through the fuses 612_1, 612_2, and 702 to randomly burn one or two or all of the links 624b, 622b, and 702b.

As the first fuse 612_1, the second fuse 612_2, and/or the third fuse 702 of a storage cell are randomly burned by the predetermined programming current, the burnt fuses of the storage cells being programmed may randomly distribute in two metal layers M2 and M4) above the semiconductor substrate 601. Accordingly, a person may not easy to obtain the manufacturer's proprietary code or information embedded in the memory array through the way of reverse engineering.

Figure 8:
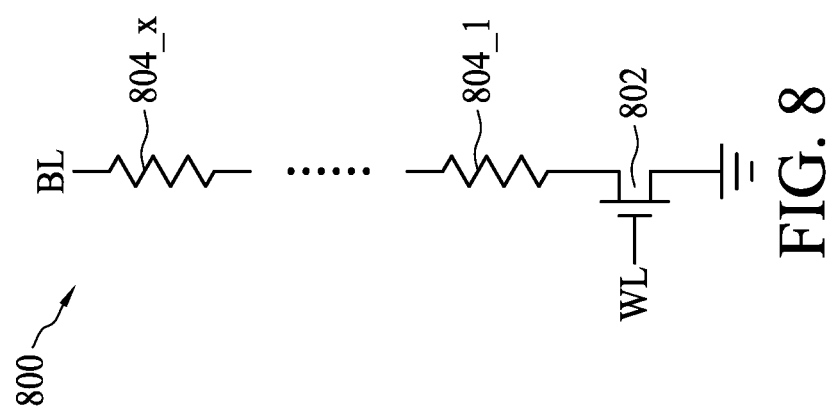
FIG. 8 is a schematic diagram illustrating a storage cell circuit in a memory array in accordance with some embodiments.

FIG. 8 is a schematic diagram illustrating a storage cell circuit 800 in a memory array in accordance with some embodiments. The memory array may be a fusible memory array. The storage cell circuit 800 may be the circuit of the layout structures 200, 600, and/or 700. The storage cell circuit 800 comprises a transistor 802 and a plurality of fuses 804_1-804_x. The parameter "x" may be an integer greater than one. According to some embodiments, the number x may not greater than the total number of metal layers above the semiconductor substrate 801. The gate of the transistor 802 is coupled to a word line WL. The plurality of fuses 804_1-804_x are serially connected between the drain of the transistor 802 and a bit line BL of the memory array. The source of the transistor 802 is coupled to the ground. According to some embodiments, the plurality of fuses 804_1-804_x may be formed in the same metal layer or different metal layers above the semiconductor substrate 801 of the memory array. For example, when the parameter "x" is 2, the first fuse 804_1 and the second fuse 804_2 may be the first fuse 212_1 and the second fuse 212_2 formed in the second metal layer M2 and the fourth metal layer M4 of FIG. 2 respectively.

For another example, when the parameter "x" is 2, the first fuse 804_1 and the second fuse 804_2 may be the first fuse 612_1 and the second fuse 612_2 formed in the fourth metal layer M4 of FIG. 6.

For another example, when the parameter "x" is 3, the first fuse 804_1, the second fuse 804_2, and the third fuse 804_3 may be the third fuse 702, the first fuse 612_1, and the second fuse 612_2 formed in the second metal layer M2 and the fourth metal layer M4 of FIG. 7 respectively.

Moreover, for each of the fuses 804_1-804_x, the fuse may be comprised of a plurality of fuses connected in parallel and located in the same metal layer above the semiconductor substrate 801.

During the programming process, if the storage cell circuit 800 is to be programmed to store a data with logical "1" (for example), then the transistor 802 is turned on by the word line WL, and a predetermined current is arranged to flow through the fuses 804_1-804_x from the bit line BL to the ground. One or more of the fuses 804_1-804_x may be burned to open or to form a relatively high resistance on the path between the bit line BL and the drain of the transistor 802. Accordingly, the storage cell circuit 800 is programmed to store a data with logical "1".

If the storage cell circuit 800 is to be programmed to store a data with logical "0" (for example), then the transistor 802 is turned off by the word line WL, and no current may flow through the fuses 804_1-804_x. Then, the fuses 804_1-804_x may be kept intact.

Briefly, in the present embodiments, for a storage cell in a fusible memory array, a plurality of fuses are coupled between the drain of a corresponding transistor and a corresponding bit line. The plurality of fuses are formed in the different metal layers above the semiconductor substrate. After the programming process, one or more of the fuses in a programmed storage cell may be burned. As the burnt fuses may not locate on the same metal layer above the semiconductor substrate, a person may not easy to obtain the manufacturer's proprietary code or information embedded in the memory array through the way of reverse engineering, and the security of the memory array may be enhanced.

Figure 9:
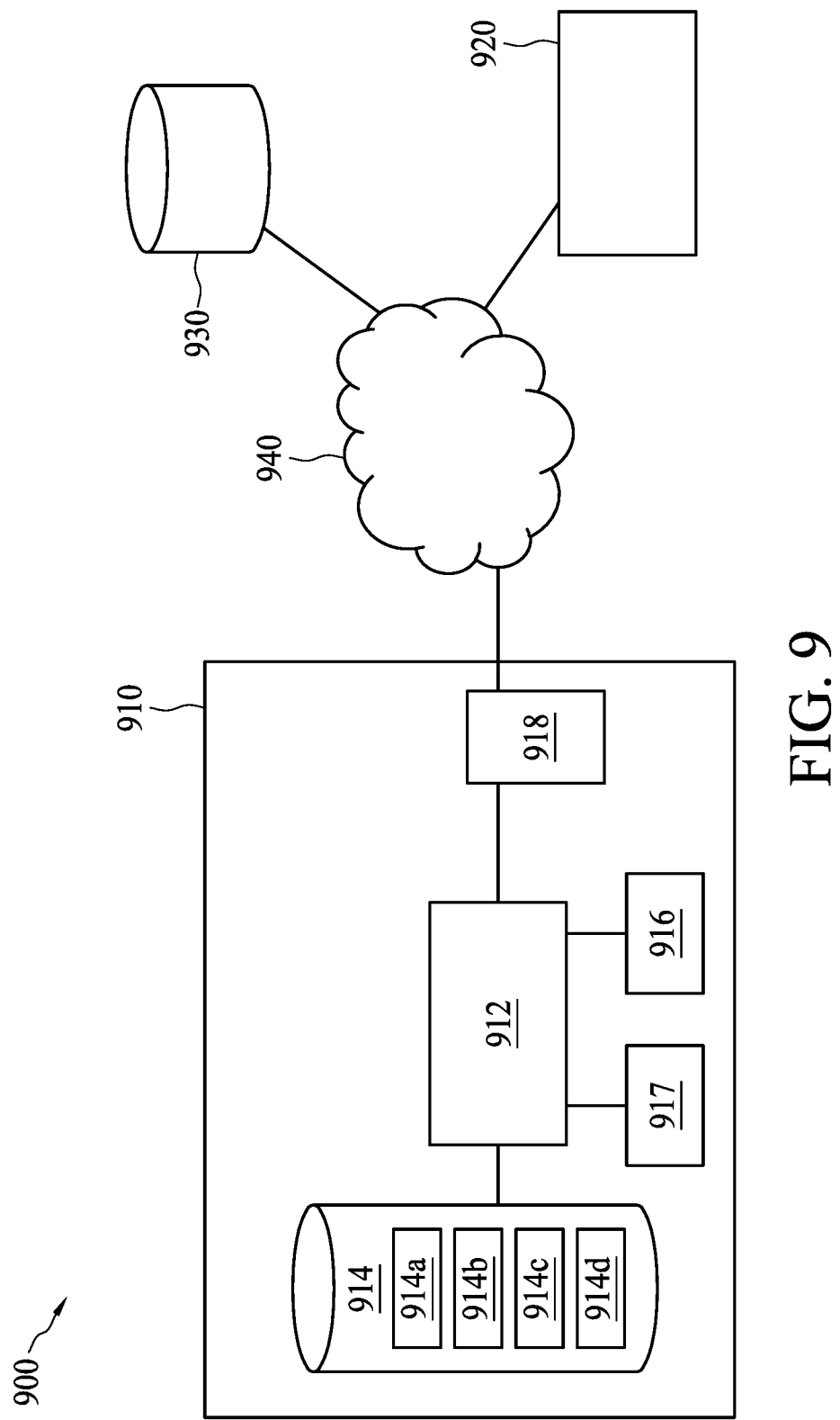
FIG. 9 is a functional block diagram of an integrated circuit design and a modeling system in accordance with an embodiment.

FIG. 9 is a functional block diagram of an integrated circuit design and modeling system 900 in accordance with an embodiment. Integrated circuit design and modeling system 900 includes a first computer system 910, a second computer system 920, a networked storage device 930, and a network 940 connecting the first computer system 910, the second computer system 920, and the networked storage device 930. In some embodiments, one or more of the second computer system 920, the storage device 930, and the network 940 are omitted. In some embodiments, two or more of the first computer system 910, second computer system 920, and/or storage device 930 are combined into a single computer system.

The first computer system 910 includes a hardware processor 912 communicatively coupled with a non-transitory, computer readable storage medium 914 encoded with, i.e., storing, a generated integrated layout 914a, a circuit design 914b, a computer program code 914c, i.e., a set of executable instructions, and a standard cell library 914d having layout patterns as described herein. The processor 912 is electrically and communicatively coupled with the computer readable storage medium 914. The processor 912 is configured to execute the set of instructions 914c encoded in the computer readable storage medium 914 in order to cause the computer 910 to be usable as a placing and routing tool for generating a layout design based on the standard cell library 914d. The processor 912 is also configured to execute the set of instructions 914c encoded in the computer readable storage medium 914 in order to cause the computer 910 to perform the operations 102~106 of the method 100.

In some embodiments, standard cell library 914d is stored in a non-transitory storage medium other than storage medium 914. In some embodiments, standard cell library 914d is stored in a non-transitory storage medium in networked storage device 930 or second computer system 920. In such case, standard cell library 914d is accessible by the processor 912 through the network.

In some embodiments, the processor 912 is a central processing unit (CPU), a multi-processor, a distributed processing system, an application specific integrated circuit (ASIC), and/or a suitable processing unit.

In some embodiments, the computer readable storage medium 914 is an electronic, magnetic, optical, electromagnetic, infrared, and/or a semiconductor system (or apparatus or device). For example, the computer readable storage medium 914 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2214 includes a compact disk-read only memory (CD-ROM), a compact disk-read/write (CD-R/W), and/or a digital video disc (DVD).

The computer system 910 includes, in at least some embodiments, an input/output interface 916 and a display unit 2217. The input/output interface 916 is coupled to the controller 912 and allows the circuit designer to manipulate the first computer system 910. In at least some embodiments, the display unit 917 displays the status of executing the placing and routing tool 914*a* in a real-time manner and provides a Graphical User Interface (GUI). In at least some embodiments, the input/output interface 916 and the display 917 allow an operator to operate the computer system 910 in an interactive manner.

It is noted that the term "metal" mentioned in the above embodiments is merely an exemplary conductive material, and this is not a limitation of the present embodiments.

In some embodiments, the present disclosure provides a method of forming a storage cell. The method comprises: forming a transistor on a semiconductor substrate; forming a plurality of fuses in at least one conductive layer on the semiconductor substrate to couple a connecting terminal of the transistor; forming a bit line to couple the plurality of fuses; and forming a word line to couple a control terminal of the transistor.

In some embodiments, the present disclosure provides a layout structure of a storage cell. The layout structure comprises a transistor, a plurality of fuses, a bit line, and a word line. The transistor is formed in a semiconductor substrate. The plurality of fuses are formed in at least one conductive layer on the semiconductor substrate for coupling a connecting terminal of the transistor. The bit line is arranged to couple the plurality of fuses. The word line is arranged to couple a control terminal of the transistor.

In some embodiments, the present disclosure provides a storage cell. The storage cell comprises a first transistor, a first conductive pad, a second conductive pad, a first resistive element, a third conductive pad, a fourth conductive pad, and a second resistive element. The first transistor is formed in a semiconductor substrate. The first conductive pad is formed in a first conductive layer on the semiconductor substrate for coupling a connecting terminal of the first transistor. The second conductive pad is formed in the first conductive layer on the semiconductor substrate. The first resistive element is formed in the first conductive layer for coupling the first conductive pad and the second conductive pad. The third conductive pad is formed in a second conductive layer on the semiconductor substrate for coupling the second conductive pad. The fourth conductive pad is formed in the second conductive layer for coupling a bit line. The second resistive element is formed in the second conductive layer for coupling the third conductive pad and the fourth conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout structure of a storage cell, comprising:
   a transistor, formed in a semiconductor substrate; and
   a plurality of fuses, formed in at least one conductive layer on the semiconductor substrate, for coupling a connecting terminal of the transistor wherein the plurality of fuses are connected in series between a bit line and the connecting terminal of the transistor,
   wherein the plurality of fuses comprises:
   a first fuse, having a first conductive pad coupled to the connecting terminal of the transistor; and
   a second fuse, having a third conductive pad coupled to a second conductive pad of the first fuse, and a fourth conductive pad coupled to the bit line.

2. The layout structure of claim 1, wherein the first fuse is disposed in a first conductive layer on the semiconductor substrate, the second fuse is disposed in a second conductive layer on the semiconductor substrate, and the second conductive layer is different from the first conductive layer.

3. The layout structure of claim 1, wherein the first fuse and the second fuse are disposed in a same conductive layer on the semiconductor substrate.

4. The layout structure of claim 1, wherein the plurality of fuses comprises:
   the first fuse, formed in a first conductive layer on the semiconductor substrate;
   the second fuse, formed in the first conductive layer on the semiconductor substrate; and
   a third fuse, formed in a second conductive layer on the semiconductor substrate,
   wherein the second conductive layer is different from the first conductive layer.

5. The layout structure of claim 4, wherein the first fuse and the second fuse are connected in parallel in the first conductive layer, and the third fuse and the first and the second fuses are connected in series between the bit line and the connecting terminal of the transistor.

6. A storage cell, comprising:
   a transistor, formed in a semiconductor substrate;
   a pair of first conductive pads, formed in a first conductive layer on the semiconductor substrate;
   a first resistive element, formed in the first conductive layer, for coupling the pair of first conductive pads;
   a pair of second conductive pads, formed in a second conductive layer on the semiconductor substrate;
   a second resistive element, formed in the second conductive layer, for coupling the pair of second conductive pads;
   a first via structure disposed over the transistor and coupled to a connecting terminal of the transistor; and
   a second via structure disposed over the second resistive element, and coupled to the second resistive element.

7. The storage cell of claim 6, wherein the second conductive layer is different from the first conductive layer.

8. The storage cell of claim 6, wherein the second conductive layer and the first conductive layer are a same conductive layer.

9. The storage cell of claim 6, wherein a first resistance of the first resistive element is different from a second resistance of the second resistive element.

10. The storage cell of claim 6, wherein a first resistance of the first resistive element is substantially equal to a second resistance of the second resistive element.

11. The storage cell of claim 6, wherein the first via structure, one of the pair of first conductive pads, one of the pair of second conductive pads and the second via structure overlap in a vertical projection direction.

12. A storage cell, comprising:
   a transistor;
   a lower conductive layer over the transistor;
   an upper conductive layer over the lower conductive layer;

a first fuse and a second fuse disposed between the lower conductive layer and the upper conductive layer;
a bit line coupled to the first fuse and the second fuse; and
a word line coupled to a control terminal of the transistor.

13. The storage cell of claim 12, wherein the first fuse and the second fuse are connected in series between the bit line and a connecting terminal of the transistor.

14. The storage cell of claim 13, Wherein the first fuse comprises:
a first conductive pad coupled to the connecting terminal of the transistor;
a second conductive pad; and
a first link connecting the first conductive pad and the second conductive pad.

15. The storage cell of claim 14, Wherein the second fuse comprises:
a third conductive pad coupled to the second conductive pad of the first fuse;
a fourth conductive pad coupled to the bit line; and
a second link connecting the third conductive pad and the fourth conductive pad.

16. The storage cell of claim 12, wherein the first fuse and the second fuse are in a same level.

17. The storage cell of claim 12, wherein the first fuse and the second fuse are in different levels.

18. The storage cell of claim 17, further comprising a middle conductive layer in a level between the first fuse and the second fuse.

19. The storage cell of claim 18, further comprising a third via between the first fuse and the middle conductive layer, and a fourth via between the second fuse and middle conductive layer.

20. The storage cell of claim 12, further comprising a first via between the lower conductive layer and the first fuse, and a second via between the second fuse and the upper conductive layer.

* * * * *